United States Patent [19]

Huang

[11] Patent Number: 5,552,732
[45] Date of Patent: Sep. 3, 1996

[54] HIGH SPEED DIVIDE BY 1.5 CLOCK GENERATOR

[75] Inventor: Yihe Huang, Palo Alto, Calif.

[73] Assignee: Exar Corporation, Fremont, Calif.

[21] Appl. No.: 428,589

[22] Filed: Apr. 25, 1995

[51] Int. Cl.[6] .................................................. H03B 19/00
[52] U.S. Cl. ........................... 327/116; 327/159; 327/218; 327/225; 377/48
[58] Field of Search ................................... 327/115, 116, 327/117, 113, 155, 159, 218, 225; 377/47, 48

[56] References Cited

U.S. PATENT DOCUMENTS

| | | | |
|---|---|---|---|
| 4,296,380 | 10/1981 | Minakuchi | 327/115 |
| 4,443,887 | 4/1984 | Shiramizu | 377/48 |
| 4,656,649 | 4/1987 | Takahashi | 327/115 |
| 5,057,784 | 10/1991 | Park | 327/116 |
| 5,077,764 | 12/1991 | Yamashita | 377/48 |
| 5,128,673 | 7/1992 | Tamamura et al. | 377/48 |
| 5,148,050 | 9/1992 | Koide | 327/115 |
| 5,172,400 | 12/1992 | Maemura | 377/48 |
| 5,347,558 | 9/1994 | Nikjou | 327/116 |
| 5,349,622 | 9/1994 | Gorisse | 377/48 |
| 5,390,223 | 2/1995 | Lindholm | 327/115 |
| 5,475,322 | 12/1995 | MacDonald | 327/116 |

FOREIGN PATENT DOCUMENTS 53-76731  7/1978  Japan ..................................... 327/115

*Primary Examiner*—Timothy P. Callahan
*Assistant Examiner*—My-Trang Nu Ton
*Attorney, Agent, or Firm*—Townsend and Townsend and Crew LLP

[57] ABSTRACT

A simple, reliable, divide by 1.5 clock generator is provided. This is done by using a divide by 3 circuit with three gates. The first two gates are clocked by the RLL clock, and the third gate is clocked by the inverse of the RLL clock. The output of the first gate is combined with the RLL clock to provide an output pulse. Another output is produced when the output of the third gate is combined with the inverse of the RLL clock. The combination of these two outputs thus produces a divide by 1.5 clock with a precisely placed rising edge. The output clock is not symmetrical, but the rising edge (or the falling edge on its inverse) is precisely placed at the 1.5 frequency.

6 Claims, 1 Drawing Sheet

5,552,732

HIGH SPEED DIVIDE BY 1.5 CLOCK GENERATOR

BACKGROUND OF THE INVENTION

The present invention relates to clock generators for generating a divide by 1.5 clock.

A divide by 1.5 clock generator is needed for providing the frequency of a clock used in a high speed READ channel for a disk drive. Typically a RLL (run-length limited) encoding clock is provided for clocking data off of a disk drive. In the READ channel, it is also necessary to have an NRZ (non-return to zero) clock with a frequency of $1/1.5 = 2/3$ times the RLL clock. Typically, this is done in one of the following three manners.

First, a phase-locked loop frequency synthesizer can be used to generate the divide by 1.5 clock. Such a synthesizer can generate any division, not just a 1.5 division. The disadvantage of this approach is the requirement for a lot of circuitry, power, and silicon area.

A second approach is to multiply the RLL clock signal by 2, and then divide it by 3. Such a clock generator is believed to be used by Microlinear in its disk drive controller. The limitation of this sort of a system is that doubling the RLL clock is not possible when the RLL clock is near the fastest system clock available. Unless the system clock is at least twice as fast as the RLL clock, it is not possible to generate a doubled RLL clock.

A third approach, which is believed to be used by SGS Thompson, uses six dynamic latches in a shift register ring with a specific pattern which is cycled through the ring. This type of a circuit requires a power-on reset and also requires a pattern generation circuit, which in turn requires more effort in the debugging phase.

Another problem is that its output clock signal has a clock input to Q output delay compared to the input clock. This delay is hard to match and can cause racing problems.

A simpler, more reliable divide by 1.5 clock generator is desirable.

SUMMARY OF THE INVENTION

The present invention provides a simple, reliable, divide by 1.5 clock generator. This is done by using a divide by 3 circuit with three gates. The first two gates are clocked by the RLL clock, and the third gate is clocked by the inverse of the RLL clock. The output of the first gate is combined with the RLL clock to provide an output pulse. Another output is produced when the output of the third gate is combined with the inverse of the RLL clock. The combination of these two outputs produces a divide by 1.5 clock with a precisely placed rising edge. The output clock is not symmetrical, but the rising edge (or the falling edge on its inverse) is precisely placed at the $1/1.5$ frequency.

In a preferred embodiment, the outputs of the first and third gates are provided through AND-gates which are in turn provided through a NOR-gate. Another NOR-gate combines the outputs of the first and second gates as an input to the first gate in order to appropriately cycle the three gates to produce the 1.5 frequency.

For a fuller understanding of the nature and advantages of the invention, reference should be made to the ensuing description taken in conjunction with the accompanying drawings.

DETAILED DESCRIPTION OF THE PREFERRED EMBODIMENTS

Figure 1:
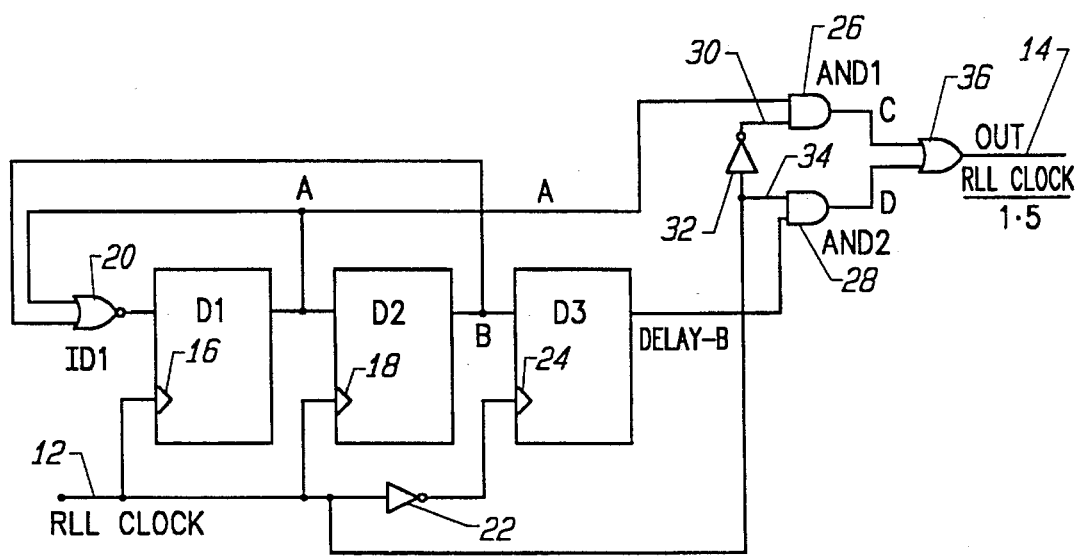
FIG. 1 is a block diagram of a clock generator according to the present invention.

FIG. 1 is a block diagram of the present invention showing the input RLL clock on a line 12 and the output RLL clock divided by 1.5 on output line 14. The input RLL clock is provided as a clocking input to a first D flip-flop D1 on clock input line 16, and to a clock input 18 of a second flip-flop D2. The output of flip-flop D1, signal A, is provided as an input to flip-flop D2. The output of flip-flop D2, signal B, is provided as an input to a third flip-flop D3.

The A and B outputs of the first two flip-flops are provided through a NOR-gate 20 back to the input of first flip-flop D1 to cycle the flip-flops. Flip-flop D3 is clocked by an inverse of the RLL clock through an inverter 22 to a clock input 24.

The output divide by 1.5 clock is provided from a combination of signal A through AND-gate 26 and the output of flip-flop D3, a delayed version of signal B, indicated as "delay$_{13}$B" through AND-gate 28. The A signal in AND-gate 26 is combined with the inverse RLL clock through an inverter 32 on an input 30, while AND-gate 28 combines the delay$_{13}$B signal with the RLL clock on a line 34.

The outputs of AND-gates 26 and 28, designated as signals C and D, respectfully, are provided through an OR-gate 36 to give the output signal on line 14.

Figure 2:
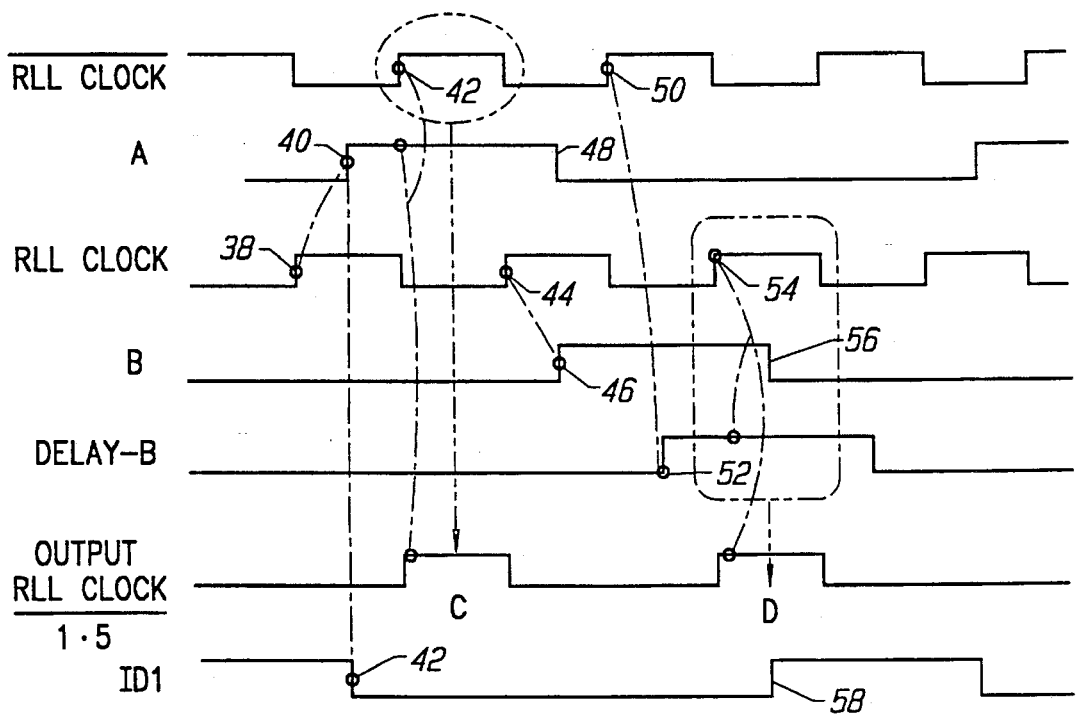
FIG. 2 is a timing diagram illustrating the operation of the circuit of FIG. 1.

The operation of the circuit of FIG. 1 is best understood by reference to the timing diagram of FIG. 2. The first signal shown in FIG. 2 is the inverted RLL clock. The next signal is the A-output of flip-flop D1, followed by the non-inverted RLL clock. Upon start up, the flip-flops will begin with a zero at their inputs and a zero at their respective outputs. The input of flip-flop D1 is indicated as signal ID1 at the bottom of FIG. 2, while the outputs of flip-flops D1 and D2 are indicated as signals A and B, respectfully. As can be seen, when ID1, A and B are all zero initially, the zero at the output A and B, provided through NOR-gate 20, provides a high signal at ID1, the input of flip-flop D1. This high signal will be clocked by the rising edge of the RLL clock at point 38 to produce a high level A output a short propagation time delay later at point 40. This high value at output A causes the NOR function to bring ID1 after point in time 40. This high level of A is provided to AND-gate 26, which is next clocked by the inverse RLL clock at a point in time 42 to produce a pulse C on the output RLL clock/1.5 for the duration of the RLL clock half cycle.

The next rising edge of the RLL clock at the end of this cycle for pulse C at time 44 clocks the high level at the output of A through to the output of flip-flop D2 to provide a high level of signal B at point in time 46. Since the input to D1, ID1 is now zero, signal A returns to zero at point in time 48 after the propagation delay through flip-flop D1. At this point, the output of AND-gate 26 is zero, since A is low, and the output of AND-gate 28 is zero since there is no delay$_{13}$B signal yet.

The inverse RLL clock at a point in time 50 then clocks the B signal through flip-flop D3 as a high level to produce the delay B signal going high at a time 52. With the delay$_{13}$B signal high at an input to AND-gate 28, AND-gate 28 produces a high level output as soon as it is clocked by the RLL clock going high at time 54. This D signal high pulse through OR-gate 36 stays high during the duration of the high portion of the half cycle of the RLL clock.

When the B output goes low at a point in time 56, both A and B are again low, causing NOR-gate 20 to produce a high level at line ID1, the input of flip-flop D1, at a point in time 58. At this point, the cycle repeats itself as shown at the beginning of the timing diagram of FIG. 2.

An examination of the output RLL clock/1.5 shows that pulses C and D have rising and/or falling edges which are a distance apart making them a frequency of the RLL clock divided by 1.5. Accordingly, the circuit generates the desired divide by 1.5 function through simple logic consisting of three flip-flops, a pair of AND-gates, a pair of inverters and a NOR-gate and an OR-gate. This divide by 1.5 function is essentially obtained by using the output of the first flip-flop, and then delaying the output of the second flip-flop by half an RLL clock cycle by using an inverted RLL clock to clock the third flip-flop. Both the A and B signals are generated by essentially a divide by 3 circuit with a frequency of RLL clock/3.

The present invention is simple and reliable. The output clock will not stop as long as them is an input RLL clock. The circuitry of the present invention allows it to work at high speeds. An additional advantage is that the delay between the output RLL clock/1.5 and the input RLL clock is a two gate delay. There is no delay due to the D flip-flop clock to Q output propagation time, so it is easy to compensate, reducing racing problems.

As will be understood by those familiar with the art, the present invention can be embodied in other specific form without departing from the spirit or essential characteristics thereof. For example, it is possible to use other types or combinations of logic rather than the AND-gates and OR-gate at the output of the circuit to produce the same boolean function. Accordingly, the disclosure of the preferred embodiments of the invention is intended to be illustrative, but not limiting, of the scope of the invention which is set forth in the following claims.

What is claimed is:

1. A clock generator circuit for generating a clock edge at a rate of 1.5 times the rate of an input clock, comprising:

a first gate having a clock input coupled to said input clock;

a second gate having an input coupled to an output of said first gate, and a clock input coupled to said input clock;

a third gate having an input coupled to an output of said second gate and a clock input coupled to an inverse of said input clock;

combinational logic for providing as a circuit output both a combination of said inverse of said input clock and said first gate output, and a combination of said input clock and said third gate output; and a circuit providing a NOR function having a first input coupled to the output of said first gate, a second input coupled to the output of said second gate, and an output coupled to an input of said first gate.

2. The clock generator of claim 1 wherein said combinational logic includes:

a first AND gate having a first input coupled to the output of said first gate, and a second input coupled to said inverse of said input clock; and a second AND gate having a first input coupled to the output of said third gate, and a second input coupled to said input clock.

3. The clock generator of claim 2 wherein said combinational logic further comprises:

an OR gate having a first input coupled to an output of said first AND gate, a second input coupled to an output of said second AND gate, and an output producing said output clock edge.

4. The clock generator of claim 1 wherein said gates are D flip-flop gates.

5. The clock generator of claim 1 wherein said input clock is an RLL clock and said output clock is a NRZ clock for a disk drive read channel.

6. A clock generator circuit for generating a clock edge at a rate of 1.5 times the rate of an input clock, comprising:

a first gate having a clock input coupled to said input clock;

a second gate having an input coupled to an output of said first gate, and a clock input coupled to said input clock;

a third gate having an input coupled to an output of said second gate and a clock input coupled to an inverse of said input clock;

a NOR gate having a first input coupled to the output of said first gate, a second input coupled to the output of said second gate, and an output coupled to an input of said first gate;

a first AND gate having a first input coupled to the output of said first gate, and a second input coupled to said inverse of said input clock;

a second AND gate having a first input coupled to the output of said third gate, and a second input coupled to said input clock; and an OR gate having a first input coupled to an output of said first AND gate, a second input coupled to an output of said second AND gate, and an output producing said output clock edge.

* * * * *